Figure 1:
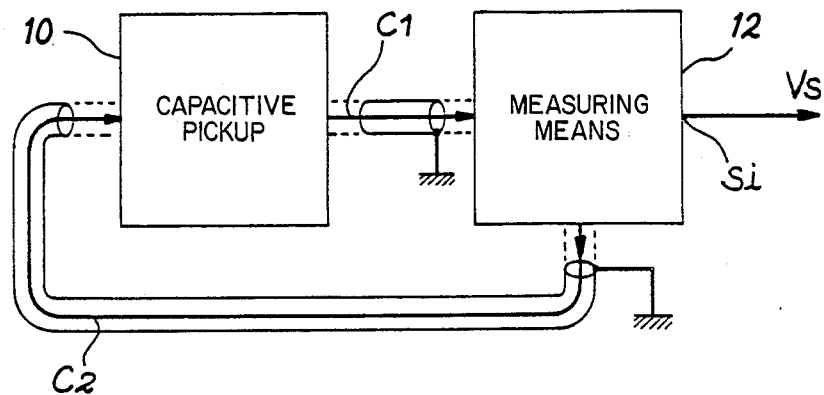

United States Patent [19]

Crescini et al.

[11] Patent Number: 4,916,393
[45] Date of Patent: Apr. 10, 1990

[54] CONTINUOUS VECTORIAL MAGNETOMETER WITH CAPACITIVE MAGNETOSTRICTION PICKUP AND GRADIOMETER INVOLVING THE APPLICATION OF THIS PICKUP

[75] Inventors: Jean Crescini, Domene; Denis Duret, Grenoble, both of France

[73] Assignee: Commissariat A l'Energie Atomique, France

[21] Appl. No.: 285,000

[22] Filed: Dec. 15, 1988

[30] Foreign Application Priority Data

Dec. 16, 1987 [FR] France .................................. 87 17566

[51] Int. Cl.$^4$ .................. G01R 33/02; G01R 33/022; G01R 27/26
[52] U.S. Cl. ................................ 324/244; 33/363 Q; 324/260; 324/686
[58] Field of Search ............... 324/200, 209, 244, 260, 324/60 R, 60 C; 33/355 R, 363 R, 363 Q

[56] References Cited

FOREIGN PATENT DOCUMENTS 0092371 10/1983 European Pat. Off. .
0246780 11/1987 European Pat. Off. ............ 324/260
0246781 11/1987 European Pat. Off. ............ 324/260

OTHER PUBLICATIONS

S. Yoshino, et al., "Measurement of Magnetostriction of Amorphous Dy-Fe Films by Cantilever Capacitance Method", Japanese Journal of Applied Physics, vol. 21, No. 10, Oct. 1, 1982, pp. 1527-1528.

E. du Tremolet de Lacheisserie, et al., "An Improved Capacitance Method of Measuring Thermal Expansion and Magnetostriction of Amorphous Ribbons: Application to FeNiCr Metallic Glasses", Revue de Physique Appliquee, vol. 18, No. 11, Nov., 1983, pp. 727-730.

T. Sonoda, et al., "Field and Force Sensors Using Amorphous Ribbons", 1986 Digests of Intermag '86—International Magnetics Conference, Apr. 14-17, 1986, p. FD-2.

Z. A. Kazei, et al., "A Capacitance Transducer for Measuring the Magnetostriction of Small Specimens at 4.2oK", Instruments and Experimental Techniques, vol. 25, No. 1, part 2, pp. 223-225.

Primary Examiner—Gerard R. Strecker

[57] ABSTRACT

Continuous vectorial magnetometer having a magnetostrictive pickup including a capacitive pickup which contains a capacitor at least one of whose electrodes is constituted of a material having magnetostrictive properties, and means for measuring the variation of the capacity of the said capacitive pickup under the action of an external magnetic field. The invention also relates to a gradiometer entailing the application of two capacitive pickups of the kind used in a magnetometer. The magnetometer is applied to the measurement of continuous or slowly varying magnetic fields, and the gradiometer to the measurement of a magnetic field gradient.

6 Claims, 3 Drawing Sheets

CONTINUOUS VECTORIAL MAGNETOMETER WITH CAPACITIVE MAGNETOSTRICTION PICKUP AND GRADIOMETER INVOLVING THE APPLICATION OF THIS PICKUP

The subject matter of the present invention is a continuous vectorial magnetometer equipped with a capacitive magnetostriction pickup, and a gradiometer involving the application of this pickup. It is applied particularly to the measurement of a magnetic field at a point along a given direction for the magnetometer and to the differential measurement of a magnetic field along a direction between two points, the fields applied to these points being able to have any desired orientation for the gradiometer.

Different types of magnetometer are well known and operate by various methods. The chief known characteristics will here be recalled.

Carrier deviation magnetometers utilizing semiconductors have a mediocre resolution ($10^{-5}$ T), and are suitable only for the measurement of strong fields.

Induction magnetometers are simple and perform well, but they do not permit measuring slow changes in the magnetic field.

Superconductor magnetometers have an excellent resolution ($10^{-14}$ T) but they operate only at low temperatures and they are not absolute.

Flux gate magnetometers operate by saturation of a nonremanent ferromagnetic material. Their resolution is good ($10^{-11}$ T) but they are subject to drift and their power consumption is considerable.

An example of a magnetostriction magnetometer is described in the article by Mermelstein and Dandridge: "Low-frequency magnetic field detection with a magnetostrictive amorphous metal ribbon," which appeared in Applied Physics Letters No. 51, vol. 7, page 545 in August 1987. It is to be noted that a magnetostrictive material is one whose mechanical deformation accompanies magnetization.

A magnetostrictive metal is coupled to a resonant ceramic plate through a material of great viscosity. The structure is excited by the ceramic at the resonant frequency of the latter. The magnetic moment of the metal has a component at this frequency which modulates that of the static magnetic field to be measured. By this means a voltage is induced at the terminals of a pickup coil. Though the resolution of this magnetometer is good ($10^{-11}$ T) it is very sensitive to induced parasitics.

The optical fiber magnetometer is described in the articles by Yariv and Winsor, "Proposed for detection of magnetic fields through magnetostrictive perturbation of optical fibers," published in 1980 in Optic Letters No. 5, page 87, and by Koo, Bucholtz, Dandridge and Tveten, "Stability of a fiber optic magnetometer using metallic glass," published in 1986 in IEEE trans. magnet., volume MAG-22, page 141.

A magnetostrictive material is glued to an optical fiber and the changes in both index and elongation are measured. This fiber is part of a laser-excited optical interferometer. The measure of the induced phase difference is associated with the measure of the magnetic field.

The resolution of this device is on the order of $10^{-9}$ T.

This technique is difficult to employ, and its industrialization is therefore problematical; on the other hand, its power consumption is high, and lastly the system is bulky.

SUMMARY OF THE INVENTION

All of the magnetometers described above present objections which the present invention can relieve. The invention advocates the use of a capacitive pickup having one of its electrodes made of magnetostrictive material, and of a system for measuring capacity variations under the effect of a magnetic field, these variations being due to deformations of the magnetostrictive material under the action of a magnetic field.

This device permits the absolute measurement of weak magnetic fields which are continuous or vary slowly in a given direction.

The resolution of the device is good ($10^{-9}$ T in ordinary use) and, on the other hand, it is not subject to drift, thanks to a counter-reactor contained in the means for measuring the variations of the capacity of the capacitive pickup.

The electric consumption of the device in accordance with the invention is low, the measuring means containing chiefly integrated circuits of low power consumption.

The device is very insensitive to induced parasitics, since the capacitive pickup is contained in an electrical shield (grounded metallic conductive body). Lastly, the present device is of small size.

More precisely, the present invention relates to a continuous vectorial magnetometer with magnetostrictive pickup, including:

A capacitive pickup comprised of at least:
a first electrically conductive electrode,
a second electrically conductive electrode,
a dielectric material interposed between the first and second electrodes, at least one of these electrodes being made of magnetostrictive material,
a modulation and counter-reactor coil, this capacitive pickup being connected to measuring means which measure the capacity variation of the said capacitive pickup under the action of an external magnetic field, such measuring means including:
a capacity measuring bridge connected to the capacitive pickup by a coaxial connection C1 and delivering a signal at an output Sp,
a synchronous demodulator connected by an input Ed1 to the output Sp of the measuring bridge and by an input Ed2 to the output So of a modulation oscillator and delivering a signal Vds to an output Sd,
an integrator connected by an input Ei to the output Sd of the synchronous demodulator and delivering at an output Si a signal Vs proportional to the said external magnetic field,
An adder having an input Ea1 connected by a switch I to the output Si of the integrator, and having an input Ea2 connected to the output So of the modulation oscillator, and delivering a signal at an output Sa,
A voltage-to-current converter connected by an input Ec to the output Sa of the adder and delivering a signal at an output Sc, the output Sc of said converter being connected by a coaxial cable C2 to the capacitive pickup.

According to a variant embodiment, each of the electrodes is composed of a magnetostrictive material, the magnetostrictive material composing the first electrode having characteristics that are the opposite of those of the magnetostrictive material composing the second electrode.

In a preferred manner, the said capacitive pickup furthermore includes a grounded exterior shielding.

Preferentially, the said capacitive pickup is of cylindrical shape.

The cylindrical shape of the capacitive pickup permits good definition of the direction of measurement, and insensitivity to radial fields. The fact that the capacitive pickup is enclosed in a grounded metal shield also enables the magnetometer to be sealed in.

The invention also has as subject matter a gradiometer making use of the capacitive pickup to measure a difference between magnetic fields H1–H2, including:

Two capacitive pickups C10, C'10, to which the fields H1 and H2 whose difference is to be measured are applied, means for measuring the difference between magnetic fields H1 and H2.

two current generators G1, G2, permitting the creation of a counter-reactor field difference between the capacitive pickups C10, C'10.

The capacitive pickups are connected to the measuring means by coaxial cables C1 and C3, a coaxial cable C2 connecting the measuring means to a capacitive pickup C10 through a current generator G1 and connecting the measuring means to the other capacitive pickup C'10 through the other current generator G2.

In accordance with a preferred embodiment of the gradiometer, the capacitive pickups C10 and C'10 have a common electrode.

The embodiment of a gradiometer in accordance with the invention makes it possible to use only one electronic measuring circuit. On the other hand, changing from the magnetometer to the gradiometer requires but few changes in the measuring means, so it is easy to shift from one to the other.

Figure 2:
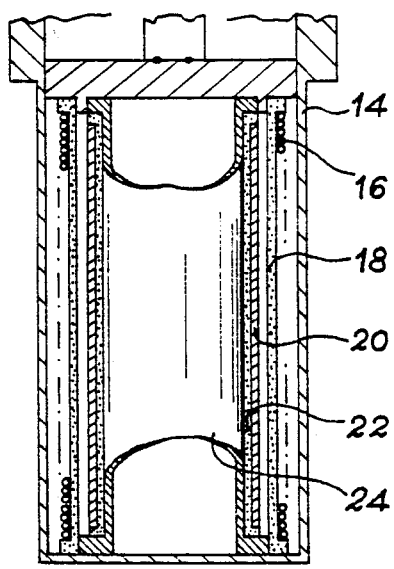
Figure 3:
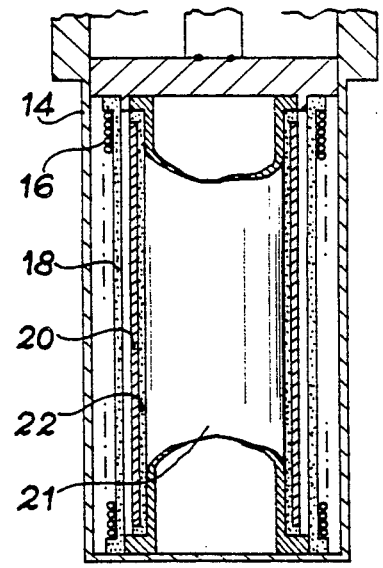
Figure 4:
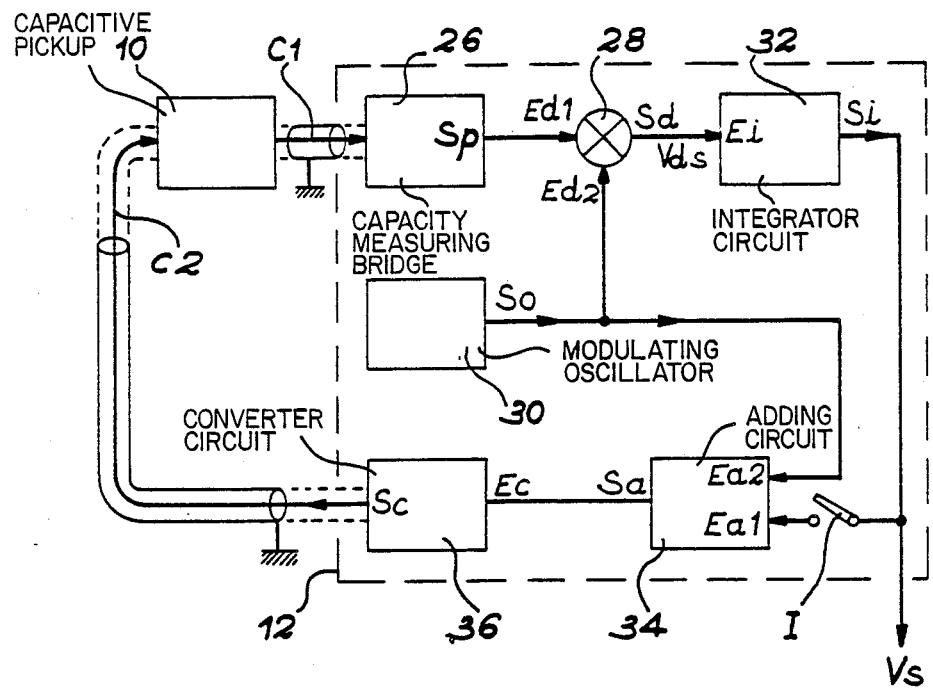
Figure 5:
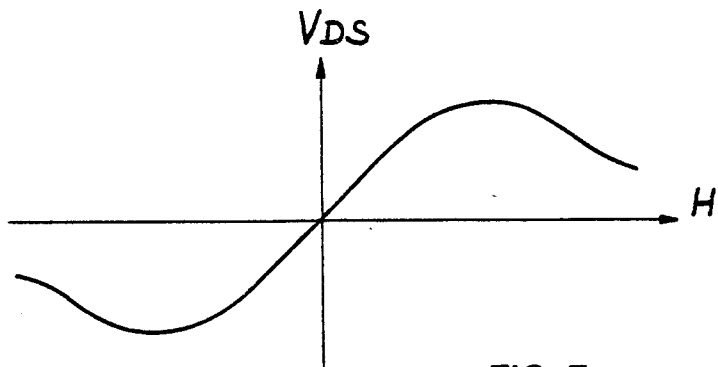
Figure 6:
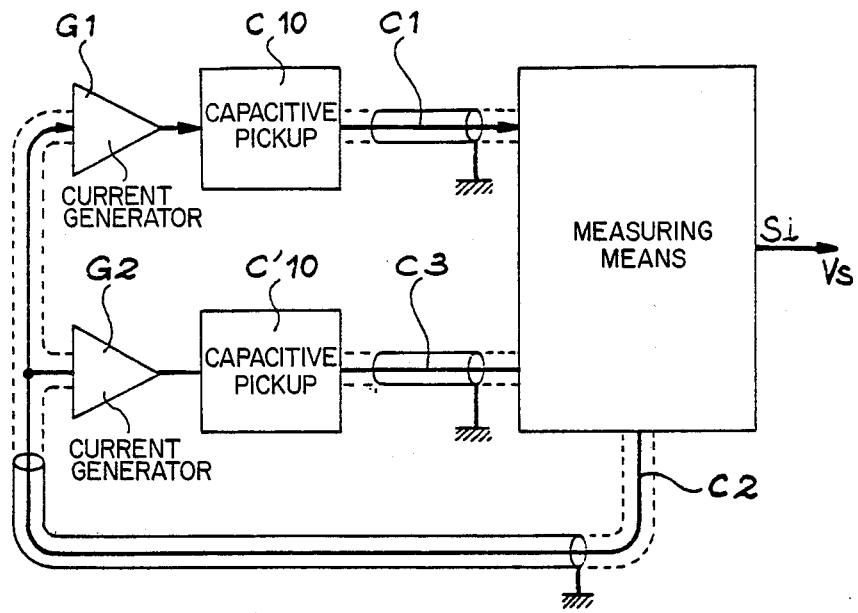
Figure 7:
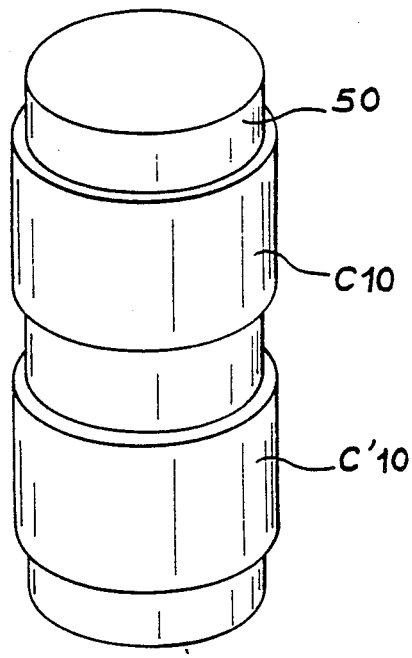

Other features and advantages of the invention will become better apparent from the description that follows, given merely by way of explanation but by no means limitation, in conjunction with the appended figures wherein:

FIG. 1 represents the general diagram of a device in accordance with the invention, FIG. 2 represents the diagram of an embodiment of a capacitive pickup in accordance with the invention, FIG. 3 represents the diagram of another embodiment of the capacitive pickup in accordance with the invention, FIG. 4 represents an overall diagram of a device in accordance with the invention, FIG. 5 represents the response signal of the pickup after synchronous demodulation in relation to the external magnetic field H, FIG. 6 represents the overall diagram of an embodiment of a gradiometer in accordance with the invention, FIG. 7 represents the pickups used in the gradiometer, in a particular configuration of the invention.

In FIG. 1, it can be seen that a device according to the invention includes a capacitive pickup 10 which contains a capacitance of which at least one of its electrodes is constituted of a material having magnetostrictive properties. The pickup 10 is connected by coaxial cables C1, C2, to means 12 for measuring the capacity of the pickup 10. These measuring means 12 deliver, at an output Si, a voltage Vs proportional to the magnetic field. The capacitive pickup 10 is first calibrated by applying known magnetic fields. The coefficient of proportionality between the voltage Vs and the field being measured is deducted therefrom.

In FIG. 2 can be seen a capacitive pickup in accordance with the invention. This pickup is cylindrical and has:
 a grounded exterior shielding 14, which is a metal envelope,
 a modulation and counter-reactor coil 16 whose purpose will be explained further on,
 a support 18 of the coil,
 a magnetostrictive material 20,
 a dielectric 22, a ribbon of a thickness of 100 microns, of polyimide for example,
 a metal electrode 24.

A change in thickness produced by the application of a magnetic field external to the magnetostrictive material 20 results in a change in the value of the capacity formed by the magnetostrictive material 20, the dielectric 22, and the metallic electrode 24. The magnetostrictive material is selected from among the amorphous magnetic materials such as the metallic glasses. Particularly suitable is Metglas ® of type 2605-S2, manufactured by Allied Corporation.

FIG. 3 represents an embodiment of a capacitive pickup. The difference between this pickup and the one described before in FIG. 2 consists in the fact that the metallic electrode 24 is replaced by an electrode of magnetostrictive material 21 whose magnetostriction characteristics are the opposite of those of the magnetostrictive material constituting the other electrode.

FIG. 4 represents an overall diagram of a magnetometer according to the invention. The capacitive pickup 10 is connected to the measuring means 12 by a coaxial cable C1. This cable C1 is in fact connected to a capacity measuring bridge 26 which delivers a signal at the output Sp. An input Ed1 of a synchronous demodulator 28 is connected to the output Sp. Another input Ed2 of the synchronous demodulator is connected to an output 30 of a modulating oscillator 30. The synchronous demodulator 28 delivers a signal Vds to an output Sd. This output Sd is connected to the input Ei of an integrator circuit 32 which delivers a voltage Vs at an output Si. To this output Si is connected an input Ea1 of an adding circuit 34 through a switch I. An input Ea2 of the adding circuit 34 is connected to the output So of the modulating oscillator. The adding circuit 34 delivers a signal to an output Sa connected to the input Ec of a circuit 36 for converting voltage to current. This converter circuit 36 delivers a signal to an output Sc and is connected by a coaxial cable C2 to the capacitive pickup 10.

The signal delivered by the measuring bridge 26 is modulated by the modulating oscillator 30. The latter is in fact connected to the modulating and counter-reactor coil 16. The field induced by this coil modulates the variations of the thickness of the magnetostrictive material forming one electrode of the capacitive pickup. Spurious signals interfering with the measurement are eliminated by the demodulation.

It can be seen in FIG. 5 that the signal Vds delivered to the output Sd of the synchronous demodulator 28 is linear, according to the variations of the external magnetic field around zero. But fluctuations external to the system can cause the slope of this linear portion of the curve, and hence the coefficient of proportionality between Vds and the magnetic field, to vary uncontrolledly.

Therefore a counter-reactor is introduced which keeps the voltage Vds at zero. This counter-reactor is composed mainly by the integrator 32 and the switch I. The output Si of the integrator 32 delivers a voltage Vs which, when switch I is closed, will permit a magnetic field opposed to the external magnetic field to be induced, after its conversion to current by the voltage-to-current converter 36, in the modulation and counter-reactor coil 16. The voltage Vs necessary for holding Vds at zero is therefore proportional to the external magnetic field.

FIG. 6 represents the general plan of a gradiometer according to the invention.

The gradiometer includes two capacitive pickups C10, C'10, as described above, i.e., both have at least one electrode of magnetostrictive material. Each pickup C10, C'10, is connected to coaxial cables C1, C3, to means 40 for measuring the field difference applied to the pickups C10, C'10. These measuring means 40 deliver a voltage Vs at an output Si. The voltage Vs is proportional to the applied field difference between the two pickups C10 and C'10.

The measuring means 40 are connected by a coaxial cable C2 to the two pickups C10, C'10, through the current generators G1 and G2.

The operation of the measuring means 40 is substantially the same as in the case of the magnetometer. The two pickups C10, C'10, are included in a measuring bridge. The measuring bridge delivers a voltage which is modulated by a modulating oscillator and demodulated by a synchronous demodulator. The curve representing the variations of the output voltage of the synchronous demodulator according to a magnetic field difference applied to the pickups C10, C'10, has a linear portion. The slope of this linear portion varies under the influence of uncontrollable external fluctuations. A counter-reactor making it possible to induce a magnetic field gradient opposed to the magnetic field gradient to be measured between the two pickups C10, C'10, is applied by an integrator circuit and the two current generators G1, G2. In this manner the output voltage of the synchronous demodulator is constantly held at zero. The voltage put out by the integrator is the voltage that is found at the output Si of the measuring means, and it is proportional to the difference between external magnetic fields.

In FIG. 7 is seen a particular embodiment of the invention adapted for the measurement of a gradient between two magnetic fields of the same direction. The two capacitive pickups C10, C/10 have a common electrode 50. In the case of a cylindrical pickup, it is the central electrode, the other components of the pickups being wound around it.

We claim:

1. Continuous vectorial magnetometer having a magnetostrictive pickup, including:
   a capacitive pickup (10) having at least:
   on the inside of a modulation and counter reactor coil (16),
   one first electrically conductive electrode,
   one second electrically conductive electrode,
   a dielectric material (22) interposed between the first and the second electrodes, at least one of these electrodes being made of magnetostrictive material,
   this capacitive pickup (10) being connected to measuring means (12) measuring the variation of the capacity of the said capacitive pickup (10) under the action of an external magnetic field, these measuring means (12) including:
   a capacity measuring bridge (26) connected to the capacitive pickup (10) by a coaxial connection C1 and delivering a signal at an output Sp,
   a synchronous demodulator (28) connected by an input Ed1 to the output Sp of the measuring bridge (26) and by a input Ed2 to the output So of a modulating oscillator (30), and putting out a signal Vds at an output Sd,
   an integrator (32) connected by an input Ei to the output Sd of the synchronous demodulator (28) and delivering at an output Si a signal Vs proportional to the said external magnetic field,
   an adder (34) having an input Ea1 connected by a switch I to the output Si of the integrator (32) and having an input Ea2 connected to the output So of the modulating oscillator (30) and delivering a signal at an output Sa,
   a voltage-to-current converter (36) connected by an input Ec to the output Sa of the adder (34) and delivering a signal at an output Sc, the output Sc of said converter (36) being connected by a coaxial cable C2 to the capacitive detector (10).

2. Magnetometer in accordance with claim 1, characterized in that each of the electrodes is composed of a magnetostrictive material, the magnetostrictive material composing the first electrode having charcteristics opposite to the magnetostrictive characteristics of the magnetostrictive material composing the second electrode.

3. Magnetometer in accordance with claim 1, characterized in that the said capacitive pickup (10) furthermore includes a grounded external shielding (14).

4. Magnetometer in accordance with claim 1, characterized in that the said capacitive pickup (10) is of cylindrical shape.

5. Gradiometer for measuring a difference in magnetic fields H1-H2, including:
   two capacitive pickups C10, C'10, to which the fields H1 and H2 whose difference is to be measured are applied, respectively, each capacitive pickup having at least, on the inside of a modulation and counter reactor coil, one first electrically conductive electrode, one second electrically conductive electrode, a dielectric material (22) interposed between the first and the second electrodes, at least one of these electrodes being made of magnetostrictive material,
   means (12) for measuring the difference in magnetic fields H1-H2,
   two current generators G1, G2, permitting creation of a counter-reaction field difference between the capacitive pickups C10, C'10, and in that the capacitive pickups are connected to the measuring means (40) by coaxial cables C1, C3, a coaxial cable C2 connecting the measuring means (40) to a capacitive pickup C10 through the medium of a current generator G1 and connecting the measuring means (40) to the other capacitive pickup C'10 through the medium of the other current generator G2.

6. Gradiometer in accordance with claim 5, characterized in that the capacitive detectors C10, C'10, have a common electrode (50).

* * * * *